United States Patent
Takahashi et al.

(10) Patent No.: US 9,312,105 B2
(45) Date of Patent: Apr. 12, 2016

(54) METHOD FOR ETCHING INSULATION FILM

(71) Applicant: TOKYO ELECTRON LIMITED, Tokyo (JP)

(72) Inventors: Akira Takahashi, Miyagi (JP); Kei Nakayama, Tokyo (JP); Yoshiki Igarashi, Miyagi (JP); Shin Hirotsu, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 14/730,394

(22) Filed: Jun. 4, 2015

(65) Prior Publication Data
US 2015/0371830 A1 Dec. 24, 2015

(30) Foreign Application Priority Data

Jun. 19, 2014 (JP) ................... 2014-126520

(51) Int. Cl.
| | |
|---|---|
| H01L 21/3065 | (2006.01) |
| H01J 37/32 | (2006.01) |
| H01L 21/02 | (2006.01) |
| H01L 21/311 | (2006.01) |
| H01L 21/3213 | (2006.01) |
| H01L 21/67 | (2006.01) |

(52) U.S. Cl.
CPC ..... *H01J 37/32165* (2013.01); *H01J 37/32009* (2013.01); *H01J 37/32082* (2013.01); *H01J 37/32137* (2013.01); *H01J 37/32146* (2013.01); *H01J 37/32449* (2013.01); *H01L 21/02164* (2013.01); *H01L 21/3065* (2013.01); *H01L 21/30655* (2013.01); *H01L 21/31116* (2013.01); *H01L 21/31144* (2013.01); *H01L 21/32137* (2013.01); *H01L 21/67069* (2013.01)

(58) Field of Classification Search
None
See application file for complete search history.

(56) References Cited

U.S. PATENT DOCUMENTS

2010/0190350 A1* 7/2010 Yatsuda ............ H01J 37/32091
438/710

FOREIGN PATENT DOCUMENTS

JP 2000-311890 A 11/2000

* cited by examiner

*Primary Examiner* — Jiong-Ping Lu
(74) *Attorney, Agent, or Firm* — Rothwell, Figg, Ernst & Manbeck, P.C.

(57) ABSTRACT

Disclosed is a method for etching an insulation film of a processing target object. The method includes: in a first term, periodically switching ON and OFF of a high frequency power so as to excite a processing gas containing fluorocarbon and supplied into a processing container of a plasma processing apparatus; and in a second term subsequent to the first term, setting the high frequency power to be continuously turned ON so as to excite the processing gas supplied into the processing container. In one cycle consisting of a term where the high frequency is turned ON and a term where the high frequency power is turned OFF in the first term, the second term is longer than the term where the high frequency power is turned ON.

4 Claims, 5 Drawing Sheets

METHOD FOR ETCHING INSULATION FILM

CROSS-REFERENCE TO RELATED APPLICATIONS

This application is based on and claims priority from Japanese Patent Application No. 2014-126520, filed on Jun. 19, 2014, with the Japan Patent Office, the disclosures of which are incorporated herein in its entirety by reference.

TECHNICAL FIELD

An exemplary embodiment of the present disclosure relates to a method for etching an insulation film.

BACKGROUND

In manufacturing an electronic device, a contact opening may be formed in an interlayer insulation film. In a processing target object having the interlayer insulation film, the interlayer insulation film is formed on a wiring layer, and a mask made of an organic film is provided on the interlayer dielectric film to form an opening. In order to form the opening in the interlayer insulation film of the processing target object, a plasma etching is generally used.

In the plasma etching of the interlayer insulation film, a processing gas containing fluorocarbon is excited in a processing container of a plasma processing apparatus. The insulation film is etched by the active species generated thereby.

Such a plasma etching is disclosed in Japanese Patent Laid-Open Publication No. 2000-311890. In the plasma etching disclosed in Japanese Patent Laid-Open Publication No. 2000-311890, ON and OFF of a high frequency power for exciting the processing gas are periodically switched.

SUMMARY

In an aspect, there is provided a method for etching an insulation film of a processing target object. The processing target object includes a wiring layer, the insulation film formed on the wiring layer, and a mask formed of an organic film on the insulation film. The method includes: (a) in a first term, periodically switching ON and OFF of a high frequency power so as to excite a processing gas containing fluorocarbon and supplied into a processing container of a plasma processing apparatus (hereinafter, referred to as "first step"); and (b) in a second term subsequent to the first term, setting the high frequency power to be continuously turned ON so as to excite the processing gas supplied into the processing container (hereinafter, referred to as "second step"). In one cycle consisting of a term where the high frequency is turned ON and a term where the high frequency power is turned OFF in the first term, the second term is longer than the term where the high frequency power is turned ON. In this method, the first step and the second step are alternately repeated. In an exemplary embodiment, the insulation film is made of silicon oxide, and the wiring layer is made of polycrystalline silicon or tungsten.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

In the following detailed description, reference is made to the accompanying drawing, which form a part hereof. The illustrative embodiments described in the detailed description, drawing, and claims are not meant to be limiting. Other embodiments may be utilized, and other changes may be made, without departing from the spirit or scope of the subject matter presented here.

What is requested in the etching of the insulation film is to suppress an etching of a mask and a wiring layer, that is, to have a selectivity. However, in the conventional plasma etching, the etching of the mask and the wiring layer is not sufficiently suppressed with respect to the etching of the insulation film.

Therefore, it becomes necessary to selectively etch the insulation film with respect to the mask and the wiring layer.

In an aspect, there is provided a method for etching an insulation film of a processing target object. The processing target object includes a wiring layer, the insulation film formed on the wiring layer, and a mask formed of an organic film on the insulation film. The method includes: (a) in a first term, periodically switching ON and OFF of a high frequency power so as to excite a processing gas containing fluorocarbon and supplied into a processing container of a plasma processing apparatus (hereinafter, referred to as "first step"); and (b) in a second term subsequent to the first term, setting the high frequency power to be continuously turned ON so as to excite the processing gas supplied into the processing container (hereinafter, referred to as "second step"). In one cycle consisting of a term where the high frequency is turned ON and a term where the high frequency power is turned OFF in the first term, the second term is longer than the term where the high frequency power is turned ON. In this method, the first step and the second step are alternately repeated. In an exemplary embodiment, the insulation film is made of silicon oxide, and the wiring layer is made of polycrystalline silicon or tungsten.

In the first term of this method, ON and OFF of the high frequency power are periodically switched. By the supply of the high frequency power in the first term, that is, the supply of the high frequency power, of which the ON and OFF are alternately switched, high-order active species are mainly generated from the fluorocarbon, rather than low-order active species. The high-order active species are easily attached to a surface of the mask, and form a protective film for protecting the mask during the etching of the insulation film. The high-order active species hardly reach a deep portion of an opening to be formed, and thus, a film for protection the wiring layer may not be formed.

Meanwhile, in the second term, the high frequency power is set to be continuously turned ON. By the supply of the high frequency power in the second term, that is, the supply of the high frequency power, of which the ON state is continuously maintained, the low-order active species are mainly generated from the fluorocarbon, rather than the high-order active species. That is, the dissociation degree of the fluorocarbon which is obtained by the supply of the high frequency power in the second term becomes higher than the dissociation degree of the fluorocarbon which is obtained by the supply of the high frequency power in the first term. The low-order active species may etch the mask considerably, in which the low-order active species may reach the deep portion of the opening to form a protective film on the wiring layer. Therefore, the mask and the wiring layer may be protected during the etching of the insulation film by alternately and repeatedly performing the first step and the second step. Therefore, according to this method, the insulation film may be selectively etched with respect to the mask and the wiring layer.

In an exemplary embodiment, the insulation film may be a single film. Further, in an exemplary embodiment, the second term may be a long term which is one hundred or more times the term where the high frequency power is turned ON in the one cycle.

As described above, the insulation film may be selectively etched with respect to the mask and the wiring layer.

Hereinafter, various exemplary embodiments will be described in detail with reference to the accompanying drawings. In the following description, same or corresponding elements will be given the same reference numerals.

Figure 1:
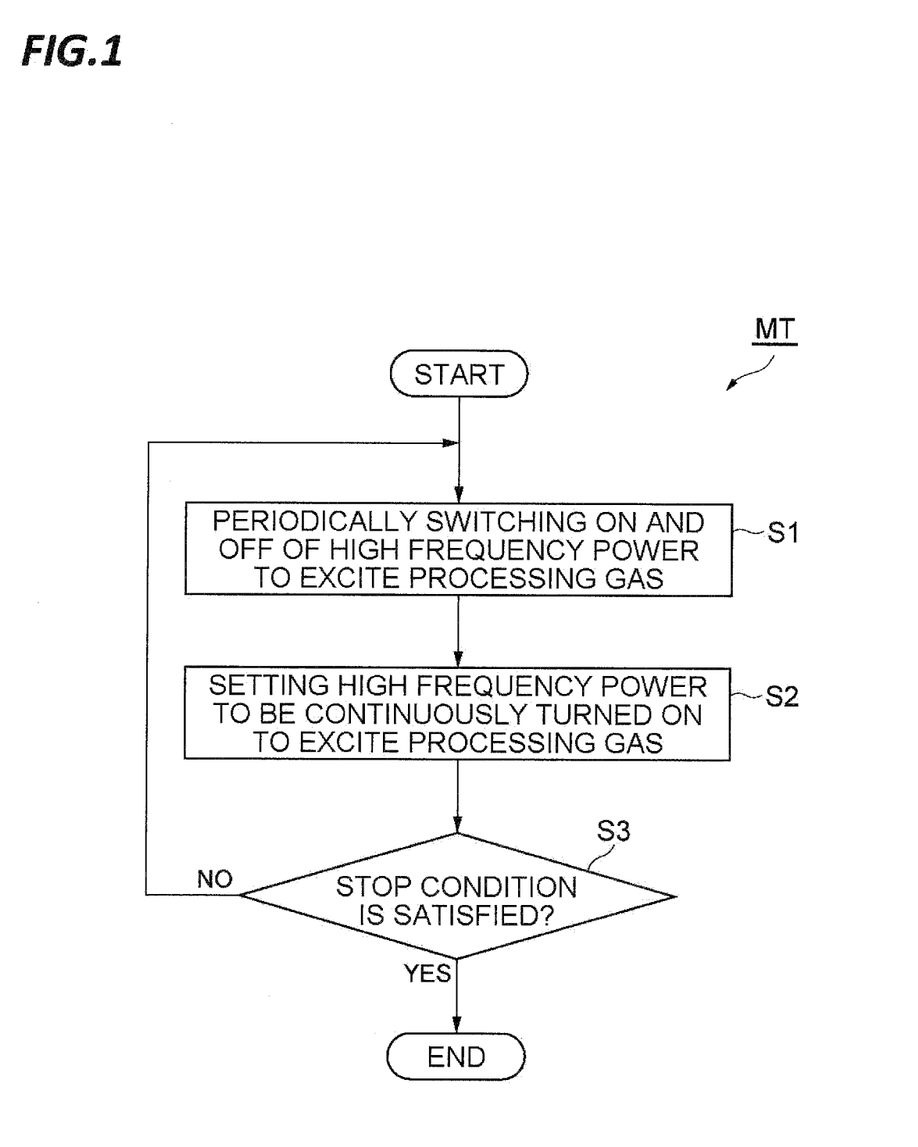
FIG. 1 is a flow chart illustrating a method for etching an insulation film according to an exemplary embodiment.

FIG. 1 is a flow chart illustrating a method for etching an insulation film according to an exemplary embodiment. The method MT illustrated in FIG. 1 is a method for etching an insulation film of a processing target object (hereinafter, referred to as "wafer W"), and includes step S1 and step S2 which are alternately repeated.

Figure 2:
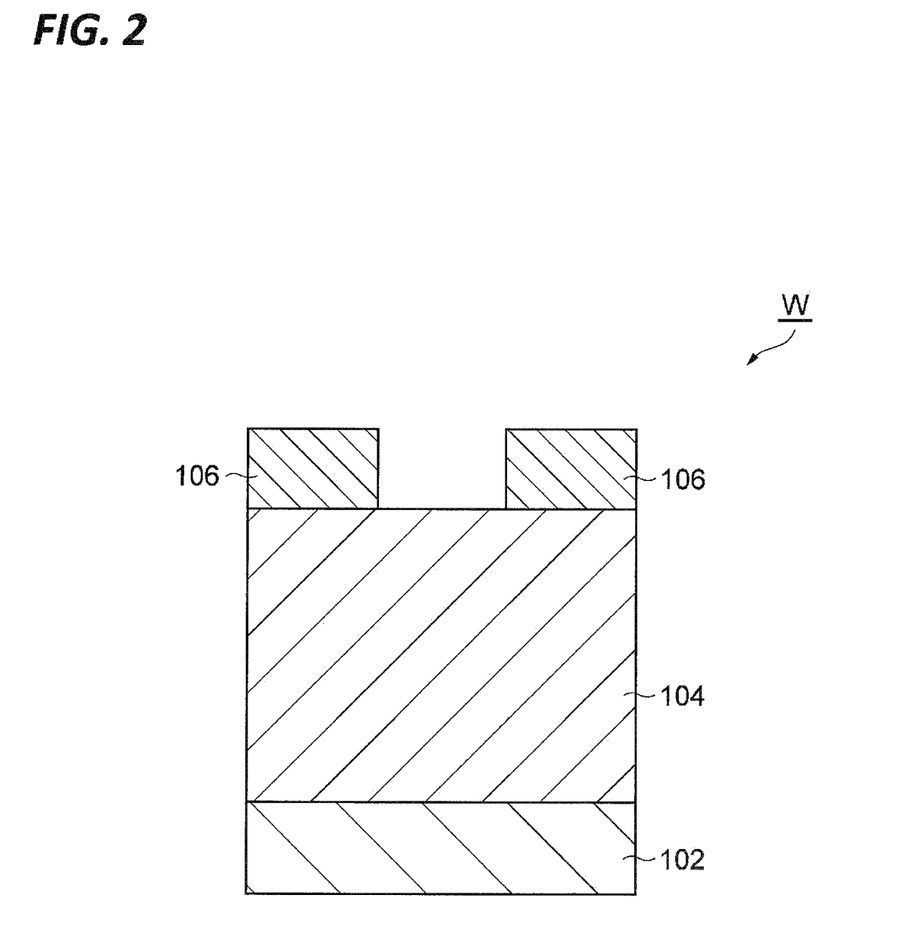
FIG. 2 is a view illustrating an exemplary processing target object.

FIG. 2 is a view illustrating an exemplary processing target object. The method may be applied to, for example, the wafer W illustrated in FIG. 2. The wafer W includes a wiring layer 102, an insulation film 104, and a mask 106. The wiring layer 102 is made of for example, polycrystalline silicon or tungsten.

The insulation film 104 is formed on the wiring layer 102. In an exemplary embodiment, the insulation film 104 is a single insulation film, that is, a single layer. Further, in an exemplary embodiment, the insulation film 104 serves as an interlayer insulation film, and is made of, for example, silicon oxide. When the insulation film 104 may be made of any material as long as it is selectively etched with respect to the wiring layer 102 and the mask 106 using plasma of fluorocarbon gas. The mask 106 is provided on the insulation film 104. The mask 106 is made of, for example, amorphous carbon or a resist material. In the mask 106, a pattern to be transferred to the insulation film 104 is formed. That is, an opening is formed in the mask 106.

Figure 3:
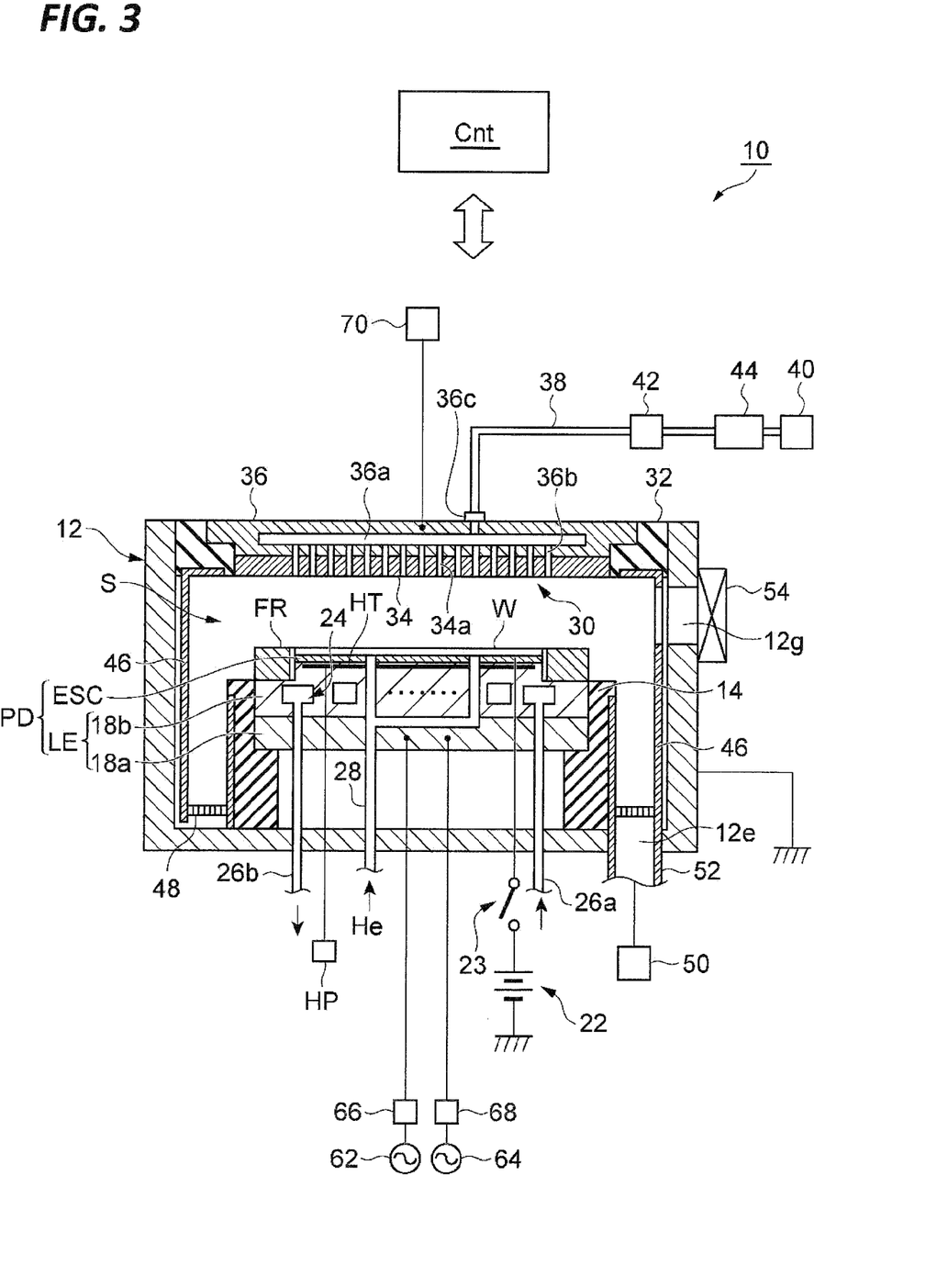
FIG. 3 is a view schematically illustrating a plasma processing apparatus according to an exemplary embodiment.

In performing the method MT, the plasma processing apparatus illustrated in FIG. 3 may be used. FIG. 3 is a view schematically illustrating a plasma processing apparatus according to an exemplary embodiment. As illustrated in FIG. 3, the plasma processing apparatus 10 is a capacitively coupled plasma etching apparatus and includes a processing container 12. The processing container 12 has a substantially cylindrical shape. The processing container 12 is made of, for example, aluminum, and an anodic oxidization treatment is performed on the inner wall surface thereof. The processing container 12 is grounded for safety.

A substantially cylindrical support 14 is provided on a bottom portion of the processing container 12. The support 14 is made of, for example, an insulating material. The support 14 extends vertically from the bottom portion of the processing container 12 within the processing container 12. Further, a placing table PD is provided within the processing container 12. The placing table PD is supported by the support 14.

The placing table PD holds the wafer W on the top surface thereof. The placing table PD includes the wafer W and an electrostatic chuck ESC. The lower electrode LE includes a first plate 18a and a second plate 18b. The first plate 18a and the second plate 18b are made of a metal such as, for example, aluminum, and have substantially a disk shape. The second plate 18b is provided on the first plate 18a, and is electrically connected to the first plate 18a.

The electrostatic chuck ESC is provided on the second plate 18b. The electrostatic chuck ESC has a structure in which an electrode made of a conductive film is provided between a pair of insulation layers or insulation sheets. A direct current ("DC") power supply 22 is electrically connected to the electrode of the electrostatic chuck ESC via a switch 23. The electrostatic chuck ESC attracts the wafer W by an electrostatic force such as, for example, a Coulomb force generated by a DC voltage from the DC power supply 22. Thus, the electrostatic chuck ESC may hold the wafer W.

A focus ring FR is disposed on a peripheral portion of the second plate 18b to surround the peripheral edge of the wafer W and the electrostatic chuck ESC. The focus ring FR is provided so as to improve etching uniformity. The focus ring FR is made of a material properly selected according to a material of an etching target film, and may be made of, for example, quartz.

A coolant flow path 24 is formed within the second plate 18b. The coolant flow path 24 serves as a temperature control mechanism. A coolant is supplied to the coolant flow path 24 from a chiller unit which is provided outside of the processing container 12 through a pipe 26a. The coolant supplied to the coolant flow path 24 is returned to the chiller unit via a pipe 26b. In this way, the coolant is supplied to the coolant flow path 24 to be circulated. By controlling the temperature of the coolant, the temperature of the wafer W supported by the electrostatic chuck ESC is controlled.

Further, a gas supply line 28 is provided in the plasma processing apparatus 10. The gas supply line 28 supplies a heat transfer gas, for example, He gas, from a heat transfer gas supply mechanism to a gap between the top surface of the electrostatic chuck ESC and the rear surface of the wafer W.

Further, a heater HT serving as a heating element is provided in the plasma processing apparatus 10. The heater HT is buried, for example, in the second plate 18b. A heater power supply HP is connected to the heater HT. A power is supplied to the heater HT from the heater power supply HP to control the temperature of the placing table PD, and thus the temperature of the wafer W placed on the placing table PD is controlled. Further, the heater HT may be buried in the electrostatic chuck ESC.

The plasma processing apparatus 10 includes an upper electrode 30. The upper electrode 30 is disposed above the placing table PD to face the placing table PD. The lower electrode LE and the upper electrode 30 are provided substantially in parallel to each other. A processing space S configured to perform a plasma processing on the wafer W is provided between the upper electrode 30 and lower electrode LE.

The upper electrode 30 is supported in the upper portion of the processing container 12 through an insulating shielding member 32. In an exemplary embodiment, the upper electrode 30 may be configured such that the vertical distance from the top surface of the placing table PD, i.e. the wafer placing surface is variable. The upper electrode 30 may include an electrode plate 34 and an electrode support 36. The electrode plate 34 faces the processing space S, and a plurality of gas ejecting holes 34a is formed through the electrode plate 34. In an exemplary embodiment, the electrode plate 34 may be made of silicon.

The electrode support 36 is configured to detachably support the electrode plate 34, and may be made of a conductive material such as, for example, aluminum. The electrode support 36 may have a water-cooled structure. A gas diffusion container 36a is provided within the electrode support 36. A plurality of gas passage holes 36b extends downwardly from the gas diffusion container 36a to communicate with the gas ejecting holes 34a. Further, a gas introducing port 36c is formed in the electrode support 36 to introduce a processing gas into the gas diffusion container 36a, and a gas supply pipe 38 is connected to the gas introducing port 36c.

A gas source group 40 is connected to the gas supply pipe 38 via a valve group 42 and a flow rate controller group 44. The gas source group 40 includes a plurality of gas sources. The plurality of gas sources may include one or more of a source of fluorocarbon gas, a source of oxygen gas ($O_2$ gas), and a source of a rare gas. The fluorocarbon gas may be a gas containing at least one of $C_4F_6$, $C_4F_8$, and $C_6F_6$. In an exemplary embodiment, the plurality of gas sources may include a source of $C_4F_6$ gas, and a source of $C_4F_8$ gas. Further, the rare gas may be a source of any rare gas such as, for example, Ar gas and He gas.

The valve group 42 includes a plurality of valves, and the flow rate controller group 44 includes a plurality of flow rate controllers such as, for example, mass flow controllers. The plurality of gas sources of the gas source group 40 is connected to the gas supply pipe 38 via the corresponding valves of the valve group 42 and the corresponding flow rate controllers of the flow rate controller group 44, respectively.

Further, in the plasma processing apparatus 10, a deposition shield 46 is detachably provided along the inner wall of the processing container 12. The deposition shield 46 is also provided on the outer periphery of the support 14. The deposition shield 46 is configured to prevent etching by-products (deposits) from being attached on the processing container 12, and may be formed by coating a ceramic such as, for example, $Y_2O_3$, on an aluminum material.

Further, at the bottom side of the processing container 12, an exhaust plate 48 is provided between the support 14 and the side wall of the processing container 12. The exhaust plate 48 may be formed by coating a ceramic such as, for example, $Y_2O_3$, on an aluminum material. Further, an exhaust port 12e is formed below the exhaust plate 48 in the processing container 12. An exhaust device 50 is connected to the exhaust port 12e through an exhaust pipe 52. The exhaust device 50 includes a vacuum pump such as, for example, a turbo molecular pump, and may decompress the inside of the processing container 12 to a desired vacuum degree. Further, a carry-in/out port 12g of a wafer W is formed on the side wall of the processing container 12. The carry-in/out port 12g is configured to be capable of being opened/closed by a gate valve 54.

The plasma processing apparatus 10 further includes a first high frequency power supply 62 and a second high frequency power supply 64. The first high frequency power supply 62 is a power supply that generates a first high frequency power for plasma generation. The first high frequency power supply 62 generates a high frequency power having a frequency in a range of 27 MHz to 100 MHz, for example, a high frequency power of 40 MHz. The first high frequency power supply 62 is connected to the lower electrode LE via a matching unit 66. The matching unit 66 is a circuit that matches an output impedance of the first high frequency power supply 62 with an input impedance of a load side (the lower electrode LE side).

The second high frequency power supply 64 is a power supply that generates a second high frequency power for drawing ions into the wafer W, i.e. a high frequency bias power. The second high frequency power supply 64 generates a high frequency bias power having a frequency in a range of 400 kHz to 13.56 MHz, for example, a high frequency bias power of 3.2 MHz. The second high frequency power supply 64 is connected to the lower electrode LE via the matching unit 68. The matching unit 68 is a circuit that matches an output impedance of the second high frequency power supply 64 with an input impedance of a load side (the lower electrode LE side).

The plasma processing apparatus 10 further includes a power supply 70. The power supply 70 is connected to the upper electrode 30. The power supply 70 applies a voltage for drawing positive ions existing in the processing space S into the electrode plate 34 to the upper electrode 30. In an exemplary embodiment, the power supply 70 is a direct current ("DC") power supply for generating a negative DC voltage. In another exemplary embodiment, the power supply 70 may be an alternating current ("AC") power supply for generating an AC voltage having a relatively low frequency. The voltage applied to the upper electrode from the power supply 70 may be a voltage of −150 V or less. That is, the voltage applied to the upper electrode 30 by the power supply 70 may be the negative voltage having an absolute value of 150 V or more. When the voltage is applied to the upper electrode 30 from the power supply 70, the positive ions existing in the processing space S collide against the electrode plate 34. Thus, secondary electrons and/or silicon are emitted from the electrode plate 34.

In an exemplary embodiment, the plasma processing apparatus 10 may further include a control unit Cnt. The control unit Cnt is, for example, a computer provided with a processor, a storage unit, an input device, and a display device, and controls respective components of the plasma processing apparatus 10. Specifically, the control unit Cnt is connected to the valve group 42, the flow rate controller group 44, the exhaust device 50, the first high frequency power supply 62, the matching unit 66, the second high frequency power supply 64, the matching unit 68, the DC power supply 70, the heater power supply HP, and the chiller unit.

The control unit Cnt is operated according to a program based on an input recipe, and transmits a control signal. With the control signal from the control unit Cnt, it is possible to control the selection and flow rate of a gas supplied from the gas source group 40, the exhaust of the exhaust device 50, the power supply from the first high frequency power supply 62 and the second high frequency power supply 64, the application of the voltage from the power supply 70, the power supply of the heater power supply HP, and the flow rate and temperature of the coolant from the chiller unit.

Figure 4A:
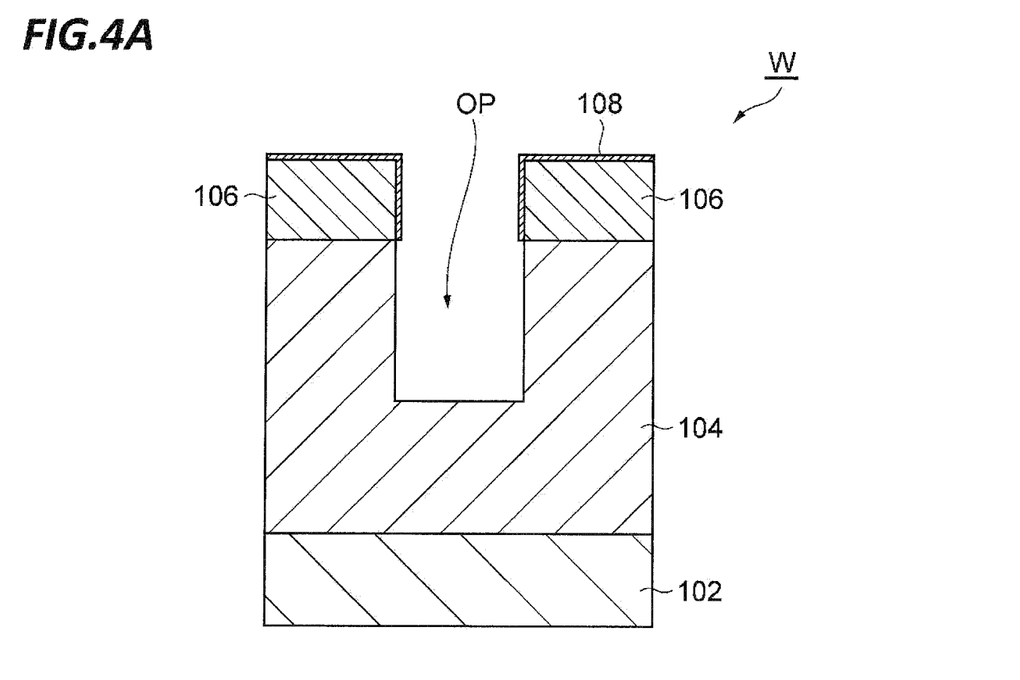
FIGS. 4A and 4B are views illustrating states of the exemplary processing target object in respective steps of the method illustrated in FIG. 1.
Figure 4B:
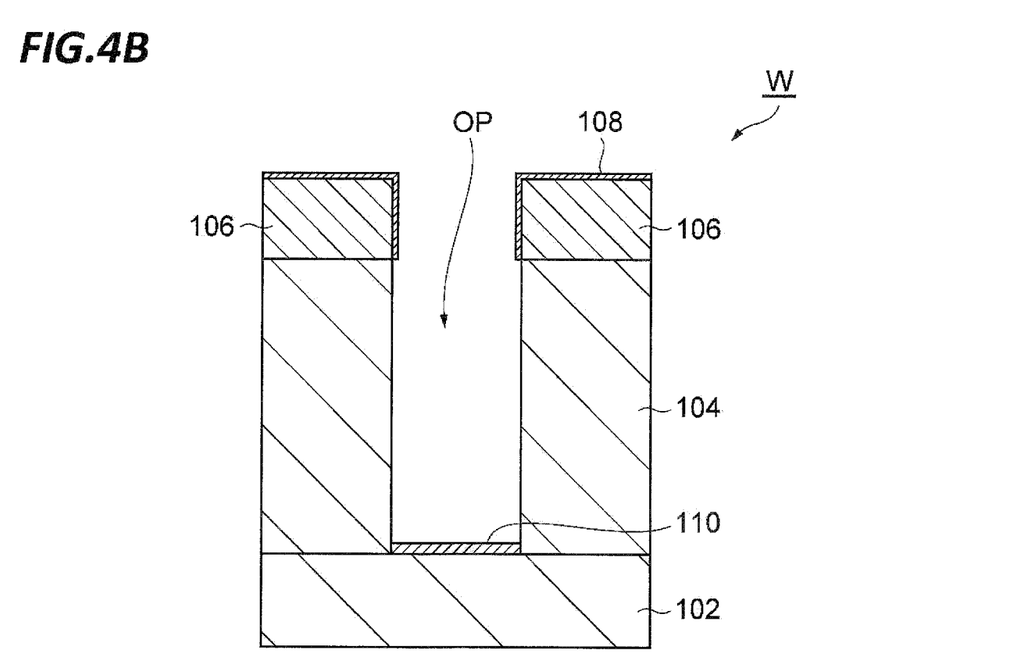
Figure 5:
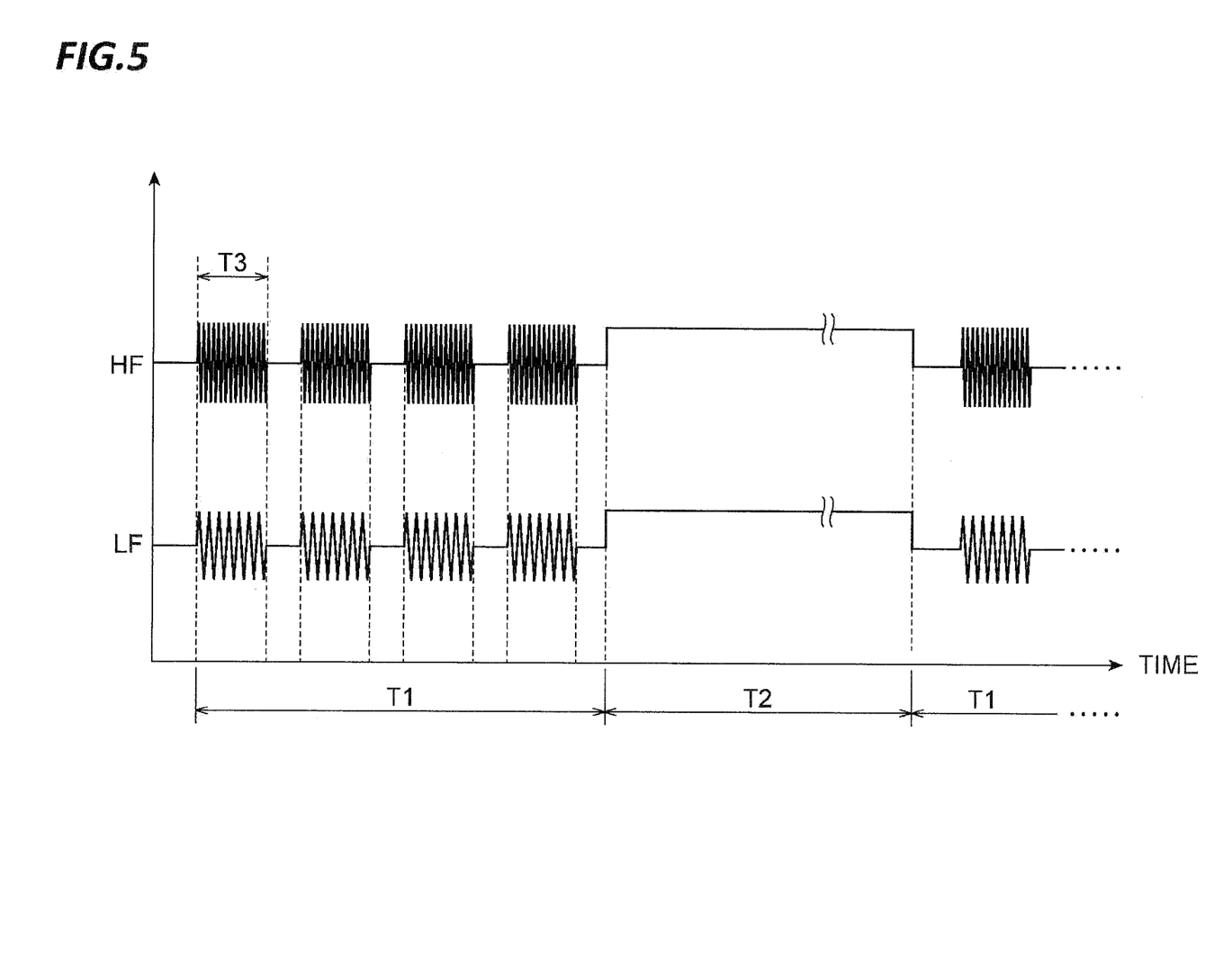
FIG. 5 is a view illustrating waveforms of a high frequency power and a high frequency bias power in the respective steps of the method illustrated in FIG. 1.

With reference to FIG. 1 again, each step of the method MT1 will be described in detail together with various controls of the control unit Cnt. In the following description, reference will be made to FIGS. 4A and 4B and FIG. 5 in addition to FIG. 1. FIGS. 4A and 4B are cross-sectional views illustrating states of an exemplary processing target object in respective steps of the method MT. FIG. 5 is a view illustrating waveforms of a high frequency power and a high frequency bias power in the respective steps of the method MT.

In step S1 of the method MT, the processing gas containing the fluorocarbon gas is supplied into the processing container 12. The processing gas may include, for example, $C_4F_6$ gas, $C_4F_8$ gas, $O_2$ gas, and Ar gas. Further, in the method MT, ON and OFF of the high frequency power HF supplied from the first high frequency power supply 62 are periodically switched in a first term T1 in which step S1 is performed. That is, in the first term T1, the high frequency power HF is supplied in a pulse form. The switching frequency of ON and OFF of the high frequency power HF is in a range of 0.1 kHz to 100 kHz. The switching frequency is, for example, 10 kHz. Further, the ratio occupied by a term T3 where the high frequency power HF is turned ON in one cycle defined by the switching frequency, i.e. a duty ratio is in a range of 5% to 95%. The duty ration is, for example, 50%.

In step S1 of an exemplary embodiment, synchronously with ON and OFF of the high frequency power HF, ON and OFF of the high frequency bias power LF supplied from the second high frequency power supply 64 may be periodically switched. That is, in the first term T1, the high frequency bias power LF may be supplied in a pulse form.

In this step S1, the processing gas is excited by the high frequency power HF supplied in the pulse form. In the plasma generated based on the high frequency power HF supplied in the pulse form, fluorocarbon is dissociated such that the amount of high-order active species is larger than that of low-order active species such as, for example, F, CF, and $CF_2$. That is, in step S1, the dissociation degree of fluorocarbon becomes lower than that in step S2 which will be described later.

As illustrated in FIG. 4A, the high-order active species are easily attached to a surface of the mask 106, and a protective film 108 for protecting the mask 106 is formed on the surface of the mask 106 during the etching of the insulation film 104 by the active species of fluorine or fluorocarbon. Further, the high-order active species have the property of hardly reaching a deep portion of an opening OP formed by the etching.

When this step S1 is performed using the plasma processing apparatus 10, the control unit Cnt controls the valve group 42 and the flow rate controller group 44 such that the processing gas is supplied into the processing container 12 at a set flow rate. Further, the control unit Cnt controls the exhaust device 50 such that the pressure of the process space S becomes a set pressure. Further, the control unit Cnt controls the first high frequency power supply 62 and the second high frequency power supply 64 such that the high frequency power HF and the high frequency bias power LF are supplied in a pulse form.

Further, the control unit Cnt may control the power supply 70 such that the voltage from the power supply 70 is applied to the upper electrode 30 during the term where the high frequency power HF is turned OFF. When a voltage is applied to the upper electrode 30 from the power supply 70, the mask 106 is modified by the secondary electrons emitted from the electrode plate 34. Thus, the plasma resistance of the mask 106 can be improved. Further, the electrification of the wafer W may be neutralized. As a result, the etching rate or the linearity of the etching may be increased.

In the method MT, the same processing gas as step S1 is supplied into the processing container 12 even in subsequent step S2. Further, in the method MT, in the second term T2 where step S2 is performed, the high frequency power HF supplied from the first high frequency power supply 62 is set to be continuously turned ON. That is, during the second term T2, the high frequency power HF is continuously supplied. In an exemplary embodiment, the second term T2 has a time length which is one hundred or more times that of the term T3. For example, the second term T2 may be set to a time length in a range of 5 seconds to 100 seconds. Further, in step S2 of an exemplary embodiment, the high frequency bias power LF supplied from the second high frequency power supply 64 may also be continuously supplied.

In step S2, the processing gas is excited by the continuously supplied high frequency power HF. In the plasma generated based on the continuously supplied high frequency power HF, fluorocarbon is dissociated such that the amount of low-order active species such as, for example, F, CF, and $CF_2$ is larger than that of high-order active species. That is, the dissociation degree of fluorocarbon in step S2 becomes higher than that of step S1.

As illustrated in FIG. 4B, the low-order active species may etch the mask 106 considerably, in which the lower-order active species may reach the deep portion of the opening OP so as to form a protective film 110 on the wiring layer 102. Therefore, according to step S2, the etching of the wiring layer 102 may be suppressed.

When step S2 is performed using the plasma processing apparatus 10, the control unit Cnt controls the valve group 42 and the flow rate controller group 44 such that the processing gas is supplied into the processing container 12 at a set flow rate. Further, the control unit Cnt controls the exhaust device 50 such that the pressure of the processing space S becomes a set pressure. Further, the control unit Cnt controls the first high frequency power supply 62 and the second high frequency power supply 64 such that the high frequency power HF and the high frequency bias power LF are continuously supplied. Further, the control unit Cnt may control the power supply 70 such that the voltage from the power supply 70 is applied to the upper electrode 30 during the second term T2.

In the method MT, in subsequent step S3, it is determined whether a stop condition is satisfied. The stop condition is satisfied, for example, when the number of times of performing a sequence including step S1 and step S2 reaches a predetermined number of times. The predetermined number of times may be, for example, ten times. When the determination result of step S3 is NO, step S1 and step S2 are repeatedly performed again. Meanwhile, when the determination result of step S3 is YES, the processes of the method MT are terminated.

According to the method MT as described above, by alternately performing step S1 and step S2, it is enabled to form the protective film on both the mask 106 and the wiring layer 102 during the etching of the insulation film 104. Therefore, according to this method MT, it is enabled to selectively etch the insulation film 104 with respect to the mask 106 and the wiring layer 102.

Although some exemplary embodiments are described above, various modified exemplary embodiments may be made without being limited to the exemplary embodiments described above. For example, the first high frequency power supply 62 may be connected to the upper electrode 30 via the matching unit 66.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A method for etching an insulation film of a processing target object that includes a wiring layer, the insulation film formed on the wiring layer, and a mask formed of an organic film on the insulation film, the method comprising:
    in a first term, periodically switching ON and OFF of at least one of a first non-DC power and a second non-DC power so as to excite a processing gas containing fluorocarbon and supplied into a processing container of a plasma processing apparatus, a frequency of the first non-DC power being higher than that of the second non-DC power; and in a second term subsequent to the first term, setting the first non-DC power to be continuously turned ON so as to excite the processing gas supplied into the processing container, in which, in one cycle consisting of a term where the first non-DC is turned ON and a term where the first non-DC power is turned OFF in the first term, the second term is longer than the term where the first non-DC power is turned ON, wherein the periodically switching ON and OFF of at least one of the first non-DC power and the second non-DC power, and the setting the first non-DC power to be continuously turned ON are alternately repeated.

2. The method of claim 1, wherein the insulation film is a single film.

3. The method of claim 1, wherein the second term is a long term which is 100 or more times the term where the first non-DC power is turned ON in the one cycle.

4. The method of claim 1, wherein, in the setting the first non-DC power to be continuously turned ON, a dissociation degree of the fluorocarbon is higher than that of the periodically switching ON and OFF of the first non-DC power.

* * * * *